(12) United States Patent
Böhm et al.

(10) Patent No.: US 6,545,900 B2
(45) Date of Patent: Apr. 8, 2003

(54) MRAM MODULE CONFIGURATION

(75) Inventors: Thomas Böhm, Zorneding (DE);
Dietmar Gogl, Fishkill, NY (US);
Martin Freitag, München (DE); Stefan Lammers, Wappingerst Falls, NY (US)

(73) Assignee: Infineon Technologies, AG, Munich (DE)

( * ) Notice: Subject to any disclaimer, the term of this patent is extended or adjusted under 35 U.S.C. 154(b) by 0 days.

(21) Appl. No.: 09/951,242

(22) Filed: Sep. 12, 2001

(65) Prior Publication Data
US 2002/0075718 A1 Jun. 20, 2002

(30) Foreign Application Priority Data
Sep. 12, 2000 (DE) .......................... 100 45 042

(51) Int. Cl.[7] ................................ G11C 17/02
(52) U.S. Cl. ................. 365/97; 365/232; 365/173
(58) Field of Search ....................... 365/97, 158, 50, 365/74, 173, 66, 55, 171, 232

(56) References Cited

U.S. PATENT DOCUMENTS

| | | | | |
|---|---|---|---|---|
| 5,946,227 A | * | 8/1999 | Naji ........................ | 365/158 |
| 5,966,323 A | * | 10/1999 | Chen et al. ................. | 365/158 |
| 6,111,781 A | * | 8/2000 | Naji ........................ | 365/158 |
| 6,111,783 A | | 8/2000 | Tran et al. ................. | 365/171 |
| 6,178,131 B1 | * | 1/2001 | Ishikawa et al. ............ | 365/157 |

FOREIGN PATENT DOCUMENTS

| | | |
|---|---|---|
| EP | 0 543 673 A2 | 5/1993 |
| FR | 2 630 859 A1 | 11/1989 |
| JP | 62006484 A | 1/1987 |
| JP | 01 035 945 | 2/1989 |
| WO | WO 00/42613 | 7/2000 |

* cited by examiner

*Primary Examiner*—David Nelms
*Assistant Examiner*—Thong Le
(74) *Attorney, Agent, or Firm*—Laurence A. Greenberg; Werner H. Stemer; Ralph E. Locher

(57) ABSTRACT

An MRAM module configuration in which, in order to increase the packing density, memory cell zones containing memory arrays and peripheral circuits are nested in one another. In this manner, an increased packing density of the memory cell is achieved which results in lowered production costs and a smaller chip space for a more compact configuration.

6 Claims, 1 Drawing Sheet

MRAM MODULE CONFIGURATION

BACKGROUND OF THE INVENTION

Field of the Invention

The present invention relates to an MRAM module configuration containing a multiplicity of memory cell zones, which each contain a memory array having a multiplicity of memory cells and peripheral circuits surrounding the memory array on the sides of the latter. The peripheral circuits surround the memory array in such a way that, in a plan view, each memory cell zone has an essentially cruciform structure.

In magnetoresistive random access memories (MRAMs), as is known, the memory effect resides in a magnetically variable electrical resistance of a memory cell. The MRAM memory cell is disposed between a word line and a bit line, which crosses the word line essentially perpendicularly and at a distance. At the crossover point between the word line and the bit line, there is a multilayer system containing a fixed or hard magnetic layer and a free or soft magnetic layer and also a tunneling barrier layer situated between these layers. The hard magnetic layer, the tunneling barrier layer and the soft magnetic layer form a magnetic tunnel junction (MTJ) cell.

SUMMARY OF THE INVENTION

It is accordingly an object of the invention to provide a MRAM module configuration that overcomes the above-mentioned disadvantages of the prior art devices of this general type, in which the highest possible packing density of memory cell zones is achieved with utilization of free corner areas.

With the foregoing and other objects in view there is provided, in accordance with the invention, a magnetoresistive random access memory (MRAM) module configuration including a multiplicity of memory cell zones each containing a memory array having a multiplicity of memory cells and peripheral circuits surrounding sides of the memory array. The peripheral circuits surround the memory array in such a way that, in a plan view, each of the memory cell zones have a substantially cruciform structure. The memory cell zones are nested in one another in such a way that, in individual rows, the memory cell zones are offset with respect to one another.

In the case of an MRAM module configuration of the type mentioned in the introduction, the object is achieved according to the invention by virtue of the fact that the memory cell zones are nested in one another in such a way that a high packing density of the module configuration is present with utilization of free corner areas of the cruciform structure.

The cruciform memory cell zones are thus configured in such a way that they can be nested in one another. A significantly increased packing density is achieved as a result. This holds true even when no ideal cruciform structures are present, rather each memory cell zone has a free area in at least one corner.

In accordance with an added feature of the invention, the peripheral circuits of one row of the memory cell zones project into free corner areas of the memory cell zones of adjacent rows.

In accordance with an additional feature of the invention, the peripheral circuits have a substantially rectangularly shaped structure.

In accordance with another feature of the invention, the memory arrays are substantially square shaped or rectangularly shaped.

Other features which are considered as characteristic for the invention are set forth in the appended claims.

Although the invention is illustrated and described herein as embodied in a MRAM module configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 2:
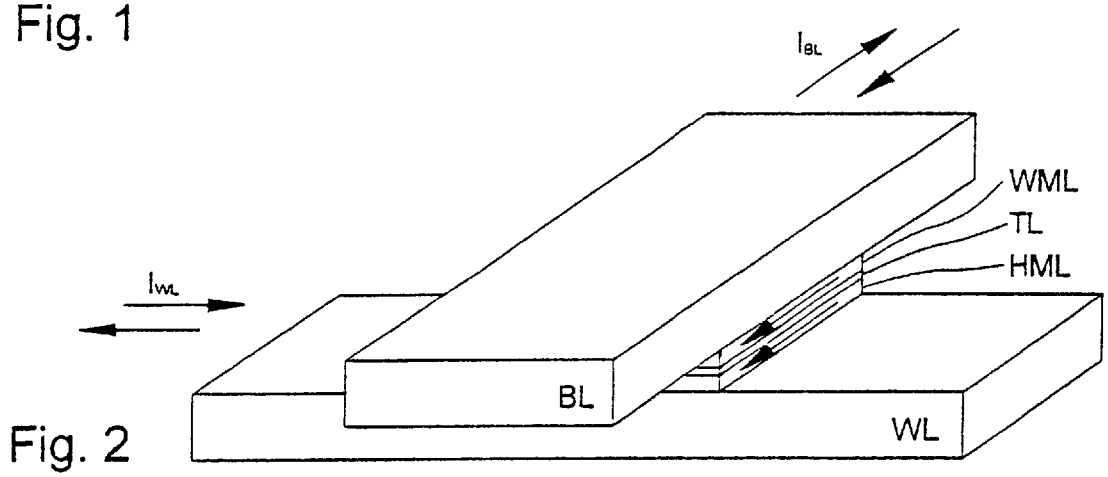
FIG. 2 is a diagrammatic, perspective view of an MTJ cell between a word line and a bit line.

In all the figures of the drawing, sub-features and integral parts that correspond to one another bear the same reference symbol in each case. Referring now to the figures of the drawing in detail and first, particularly, to FIG. 2 thereof, there is shown a MRAM memory cell disposed between a word line WL and a bit line BL, which bit line BL crosses the word line WL essentially perpendicularly and at a distance. At a crossover point between the word line WL and the bit line BL, there is a multilayer system containing a fixed or hard magnetic layer HML and a free or soft magnetic layer WML and also a tunneling barrier layer TL situated between the layers HML and WML. The hard magnetic layer HML, the tunneling barrier layer TL and the soft magnetic layer WML form a magnetic tunnel junction (MTJ) cell.

Figure 3:
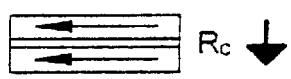
FIG. 3 is an illustration for elucidating a parallel-oriented magnetization of magnetic layers.
Figure 4:
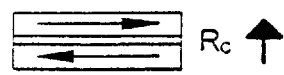
FIG. 4 is an illustration for elucidating an antiparallel-oriented magnetization of the magnetic layers.

In the MTJ cell, information is stored by the magnetization direction of the soft magnetic layer WML being rotated relative to a magnetization direction of the hard magnetic layer HML. The magnetic fields required for this are generated by a current $I_{WL}$ in the word line WL and a current $I_{BL}$ in the bit line BL. The magnetic fields are superposed at the crossover point between the word line WL and the bit line BL, that is to say in the region of the MTJ cell. If the magnetization direction of both magnetic layers HML and WML is oriented identically, then the MTJ cell has a low electrical resistance $R_C$, as is illustrated in FIG. 3. In contrast, in the case of a non-identical or antiparallel magnetization direction in the magnetic layers HML and WML, a high resistance is produced, as is illustrated in FIG. 4.

The change in resistance between the parallel magnetization direction and antiparallel magnetization direction in the magnetic layers HML and WML is utilized for information storage purposes in digital memory applications.

An extremely high storage density of the MRAM module configuration can be achieved if a plurality of memory cell zones are stacked one above the other and are each provided with corresponding interposed metallization systems.

Figure 5:
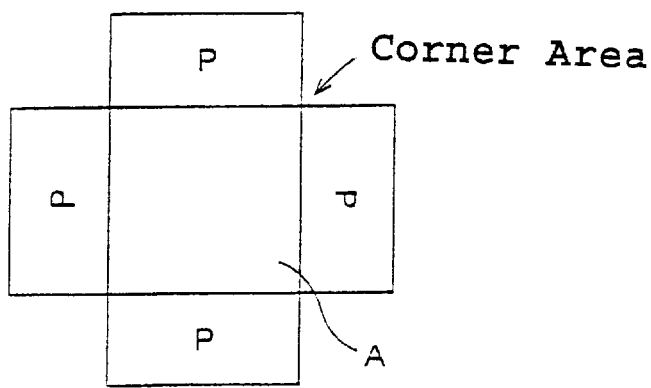
FIG. 5 is a diagrammatic plan view of a memory cell zone having a memory array and peripheral circuits.

Especially the switching of the currents $I_{WL}$ and $I_{BL}$, which are required for generating the magnetic fields during a programming operation in the individual MTJ cells, requires, on account of the relatively high current intensities up to a number of mA, areally costly peripheral circuits containing, in particular, large transistors around each individual memory array. The peripheral circuits must be provided for efficient wiring and short signal paths at the side edges of each memory array, as is shown in FIG. 5. Here, a memory array A is surrounded by four peripheral circuits P at its side edges. The peripheral circuits P are larger, the more memory arrays A are stacked one above the other in different planes. The cruciform structure shown in FIG. 5 is thus formed given a sufficiently large number of memory planes.

In addition to components for current control during the programming operation, the peripheral circuits P contain further components, such as, for example, switching units for controlling read voltages, etc.

The memory cell zone shown in FIG. 5 containing the memory array A and the four peripheral circuits P surrounding the memory array suffices to store a few megabits. MRAM module configurations with an even larger capacity require the combination of many such memory cell zones.

As can be seen from FIG. 5, the memory cell zones having a cruciform structure cannot simply be combined next to one another to form MRAM module configurations in a memory chip in the manner that is familiar from dynamic random access memory (DRAM) and other standard memories. The free areas at the corners of the cruciform structure result in a great deal of chip area being wasted, which should be prevented.

Let it be noted that the memory cell zone need not necessarily have a square structure. Moreover, the free areas at the corners need not be free in such an ideal way as is shown in FIG. 5. Therefore, a "cruciform structure" is to be understood to be a structure in which there is at any rate at least one free area at a corner of the memory cell zone.

Figure 1:
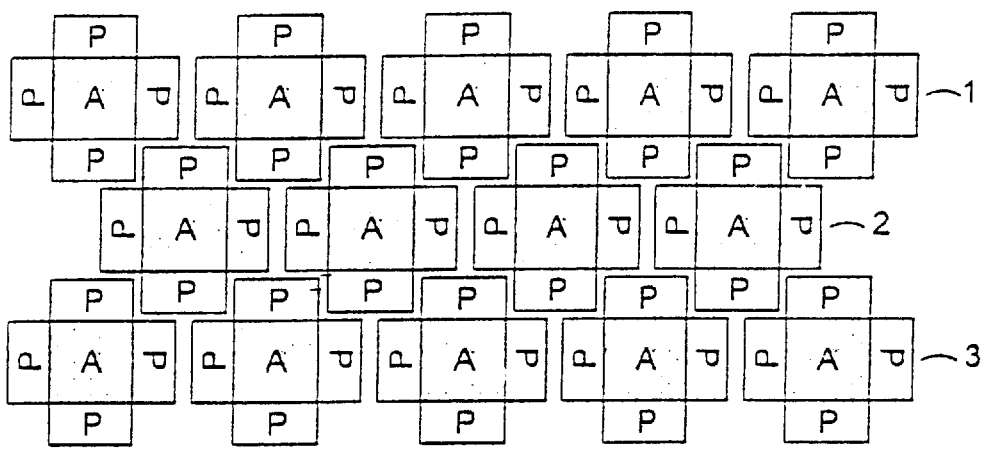
FIG. 1 is a diagrammatic plan view of an MRAM module configuration according to an exemplary embodiment of the invention.

As is shown in FIG. 1, in the MRAM module configuration according to the invention, individual memory cell zones containing the memory arrays A and the peripheral circuits P assigned thereto are disposed nested in one another in such a way that a high packing density of the module configuration is present with utilization of the free corner areas of the cruciform structure. For this purpose, rows 1, 2, 3 of the MRAM module configuration are provided such that they are offset with respect to one another, with the result that, for example in row 2, the peripheral circuits P which adjoin rows 1 and 3, respectively, are fitted exactly into the corner areas of the memory cell zones of rows 1 and 3.

The individual memory cell zones need not necessarily have the ideally cruciform structure of the exemplary embodiment of FIG. 1. Rather, it suffices for the memory cell zones to have approximately such a cruciform structure that allows the individual memory cell zones of different rows to be nested in one another.

Moreover, the peripheral circuits P need not necessarily have an ideally rectangular structure. The memory arrays are preferably configured such that they are essentially square. However, they may also have a rectangular edge or be embodied in another way. For the realization of the invention, it is entirely sufficient for the peripheral circuits P and the memory arrays A to be configured in such a way that they can be nested in one another, in order to save chip area.

The invention thus makes it possible to realize MRAM module configurations of high packing density. This significant advantage is achieved solely by the nested configuration of the individual rows of memory cell zones, which marks a fundamental departure from the previous prior art, for example DRAMs and flash memories.

We claim:

1. A magnetoresistive random access memory (MRAM) module configuration, comprising:

a multiplicity of memory cell zones each containing a memory array having a multiplicity of memory cells and peripheral circuits surrounding sides of said memory array, said peripheral circuits surrounding said memory array in such a way that, in a plan view, each of said memory cell zones have a substantially cruciform structure, and said memory cell zones being nested in one another in such a way that, in individual rows, said memory cell zones are offset with respect to one another.

2. The MRAM module configuration according to claim 1, wherein said peripheral circuits of one row of said memory cell zones project into free corner areas of said memory cell zones of adjacent rows.

3. The MRAM module configuration according to claim 1, wherein said peripheral circuits have a substantially rectangularly shaped structure.

4. The MRAM module configuration according claim 1, wherein said memory arrays are substantially square shaped.

5. The MRAM module configuration according claim 1, wherein said memory arrays are substantially rectangularly shaped.

6. A magnetoresistive random access memory (MRAM) module configuration, comprising:

a multiplicity of memory cell zones each containing a substantially rectangularly shaped memory array having sides, free corners areas and a multiplicity of memory cells and peripheral circuits surrounding said sides of said memory array, with a substantially cruciform structure of each of said memory cell zones in a plan view, and said memory cell zones being nested in one another with said memory cell zones being offset with respect to one another in individual rows, said peripheral circuits of one of said rows of said memory cell zones projecting into said free corners areas of said memory cell zones of adjacent rows.

* * * * *